(12) United States Patent
Shen

(10) Patent No.: US 6,627,993 B1
(45) Date of Patent: Sep. 30, 2003

(54) SEMICONDUCTOR DEVICE HAVING AN ELECTRICAL CONTACT AND A DIELECTRIC LINING IN A CONTACT REGION

(75) Inventor: Ming-Tung Shen, Taipei (TW)

(73) Assignee: CTS Computer Technology System Corporation, Taipei (TW)

( * ) Notice: Subject to any disclaimer, the term of this patent is extended or adjusted under 35 U.S.C. 154(b) by 0 days.

(21) Appl. No.: 09/632,566

(22) Filed: Aug. 4, 2000

(30) Foreign Application Priority Data

Apr. 25, 2000 (TW) .......................... 89107776 A

(51) Int. Cl.⁷ .............................................. H01L 23/48
(52) U.S. Cl. ........................................ 257/737; 257/773
(58) Field of Search ................................ 438/612, 622, 438/637, 639; 257/734, 737, 773, 776

(56) References Cited

U.S. PATENT DOCUMENTS

| | | | | |
|---|---|---|---|---|
| 4,552,691 A | * | 11/1985 | Shoji et al. ................ | 252/514 |
| 5,275,330 A | * | 1/1994 | Isaacs et al. ............. | 228/180.2 |
| 5,414,221 A | * | 5/1995 | Gardner ....................... | 174/261 |
| 5,796,591 A | * | 8/1998 | Dalal et al. ................ | 361/779 |
| 6,171,944 B1 | * | 1/2001 | Li et al. ....................... | 438/622 |

\* cited by examiner

Primary Examiner—Evan Pert
(74) Attorney, Agent, or Firm—Fish & Richardson P.C.

(57) ABSTRACT

A semiconductor device has a lower metal layer, a lower dielectric layer on top of the lower metal layer, an upper metal layer on top of the lower dielectric layer, an upper dielectric layer on top of the upper metal layer, and a contact region formed as a cavity that extends through the upper dielectric layer, the upper metal layer and the lower dielectric layer for access to a solder pad portion of the lower metal layer. A dielectric lining layer lines a peripheral cavity-confining surface of the cavity, and is transverse to a plane of the lower metal layer. The dielectric lining layer isolates the upper metal layer from the lower metal layer while permitting access to the solder pad portion of the lower metal layer. An electrical contact fills the cavity, and enables external electrical connection with the lower metal layer.

5 Claims, 5 Drawing Sheets

SEMICONDUCTOR DEVICE HAVING AN ELECTRICAL CONTACT AND A DIELECTRIC LINING IN A CONTACT REGION

BACKGROUND OF THE INVENTION

1. Field of the Invention

The invention relates to a semiconductor device, more particularly to a method for forming an electrical contact of a semiconductor device.

2. Description of the Related Art

Referring to FIGS. 1 and 2, a conventional semiconductor device 1 is shown to have a lower metal layer 10, a lower dielectric layer 11 on top of the lower metal layer 10, an upper metal layer 12 on top of the lower dielectric layer 11, and an upper dielectric layer 13 on top of the upper metal layer 12. The semiconductor device 1 further has a contact region 14 in the form of a cavity that extends through the upper dielectric layer 13, the upper metal layer 12 and the lower dielectric layer 11 for access to a solder pad portion 16 of the lower metal layer 10. A grounding trace 17 is disposed on the upper dielectric layer 13 and surrounds the contact region 14 to protect the semiconductor device 1 from static electricity. To enable electrical connection of the lower metal layer 10 with an external circuit (not shown), a contact body 15, which is made of solid metal, is mounted in the contact cavity 14 via conventional wire-bonding techniques. It is noted that, if liquid metal is used to form the contact body 15, short-circuiting will occur due to formation of an undesired connection between the lower and upper metal layers 10, 12.

It is desirable to provide an alternative contact-forming method for a semiconductor device so that manufacturing costs can be lowered in order to enhance market competitiveness.

SUMMARY OF THE INVENTION

Therefore, the main object of the present invention is to provide a semiconductor device and a method for forming an electrical contact of the semiconductor device at a relatively low cost.

According to one aspect of the invention, a semiconductor device comprises: a lower metal layer; a lower dielectric layer on top of the lower metal layer; an upper metal layer on top of the lower dielectric layer; an upper dielectric layer on top of the upper metal layer; a contact region formed as a cavity that extends through the upper dielectric layer, the upper metal layer and the lower dielectric layer for access to a solder pad portion of the lower metal layer; a dielectric lining layer that lines a peripheral cavity-confining surface of the cavity and that is transverse to a plane of the lower metal layer to isolate the upper metal layer from the lower metal layer while permitting access to the solder pad portion of the lower metal layer; and an electrical contact that fills the cavity and that enables external electrical connection with the lower metal layer.

According to another aspect of the invention, there is provided a contact-forming method for a semiconductor device having a lower metal layer, a lower dielectric layer on top of the lower metal layer, an upper metal layer on top of the lower dielectric layer, an upper dielectric layer on top of the upper metal layer, and a contact region formed as a cavity that extends through the upper dielectric layer, the upper metal layer and the lower dielectric layer for access to a solder pad portion of the lower metal layer. The contact-forming method comprises:

forming the semiconductor device with a dielectric lining layer that lines a peripheral cavity-confining surface of the cavity and that is transverse to a plane of the lower metal layer to isolate the upper metal layer from the lower metal layer while permitting access to the solder pad portion of the lower metal layer; and filling the cavity with a liquid metal to form an electrical contact that enables external electrical connection with the lower metal layer.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
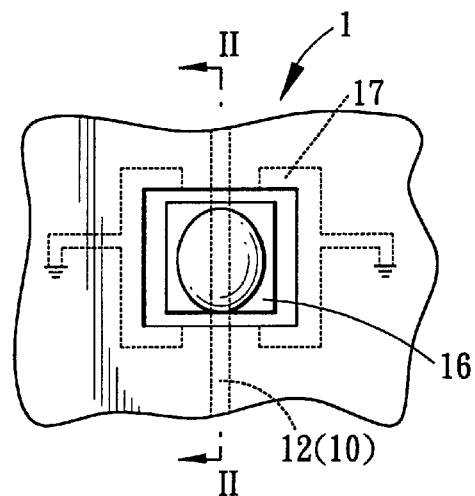
FIG. 1 is a schematic fragmentary top view illustrating a contact region of a conventional semiconductor device.
Figure 2:
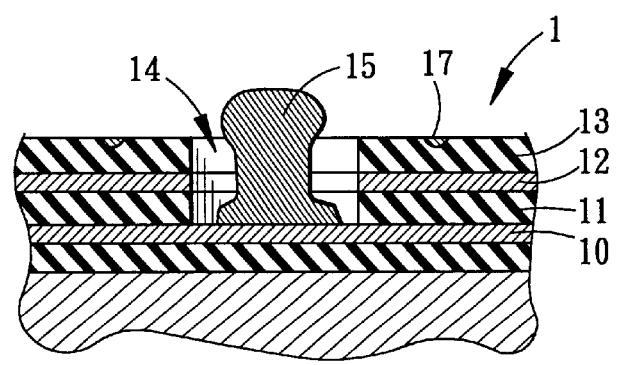
FIG. 2 is a fragmentary cross-sectional view of the conventional semiconductor device, taken along lines II—II of FIG. 1.

Before the present invention is described in greater detail in connection with the preferred embodiments, it should be noted that like elements are denoted by the same reference numerals throughout the specification.

Figure 3:
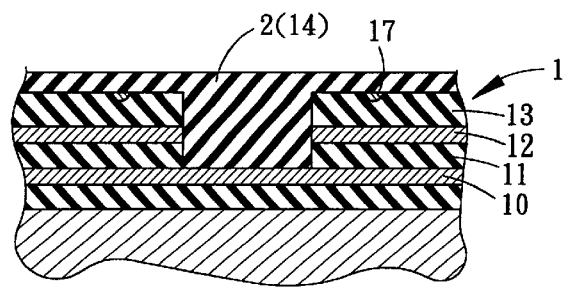
FIGS. 3 to 5 are fragmentary cross-sectional views illustrating the steps of the first preferred embodiment of a contact-forming method for a semiconductor device according to the present invention.

Referring to FIG. 3, according to the first preferred embodiment of a contact-forming method of the present invention, a semiconductor device 1 is shown to have a lower metal layer 10, a lower dielectric layer 11 on top of the lower metal:layer 10, an upper metal layer 12 on top of the lower dielectric layer 11, and an upper dielectric layer 13 on top of the upper metal layer 12. The semiconductor device 1 further has a contact region in the form of a cavity 14 that extends through the upper dielectric layer 13, the upper metal layer 12 and the lower dielectric layer 11 for access to a solder pad portion of the lower metal layer 10. A grounding trace 17 is disposed on the upper dielectric layer 13 and surrounds the cavity 14.

Figure 4:
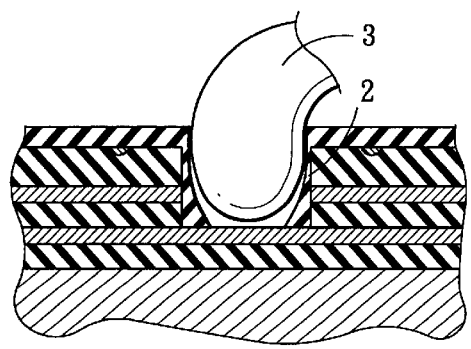
Figure 5:
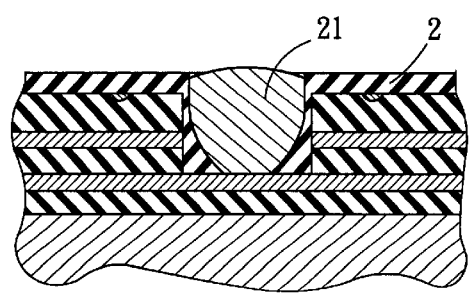

In the contact-forming method of the first preferred embodiment, a dielectric lining layer 2 is formed on the upper dielectric layer 13 and fills the cavity 14. Thereafter, as shown in FIGS. 4 and 5, a central portion of the dielectric lining layer 2 is removed from the cavity 14 with the use of a probe tool 3. At this time, the dielectric lining layer 2 is configured to line a peripheral cavity-confining surface of the cavity 14 that is transverse to a plane of the lower metal layer 10 to isolate the upper metal layer 12 from the lower metal layer 10 while permitting access to the solder pad portion of the lower metal layer 10. Finally, the cavity 14 is filled with a liquid metal, such as a conductive metal paste that contains gold, silver, copper, iron or aluminum, to form an electrical contact 21 that enables electrical connection of the lower metal layer 10 with an external circuit (not shown).

Note that, because the dielectric lining layer 2 extends on top of the upper-dielectric layer 13, the grounding trace 17 on the latter can be concealed to avoid formation of undesired connections with other circuits (not shown).

Figure 6:
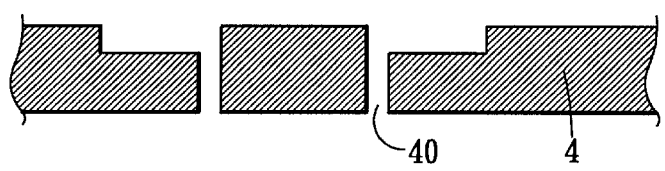
FIGS. 6 to 9 are fragmentary cross-sectional views illustrating the steps of the second preferred embodiment of a contact-forming method for a semiconductor device according to the present invention.
Figure 7:
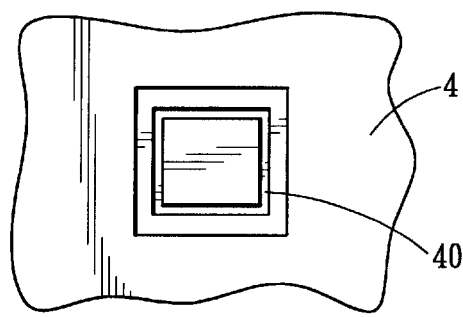
Figure 8:
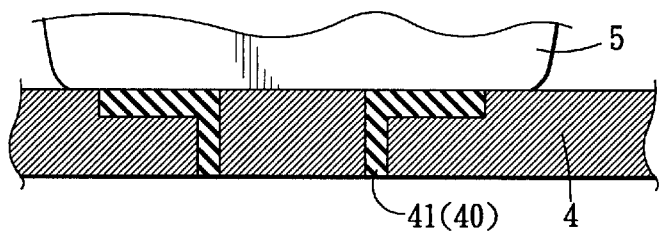
Figure 9:
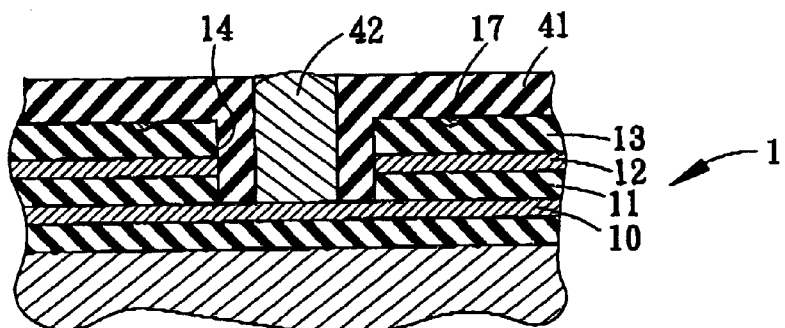

FIGS. 6 to 9 are fragmentary cross-sectional views illustrating the steps of the second preferred embodiment of a contact-forming method for a semiconductor device 1 according to the present invention. As shown in FIGS. 6 and 7, there is provided a steel plate 4 formed with a lining-forming hole 40. Referring to FIG. 8, a dielectric lining layer 41 is formed by filling the lining-forming hole 40 with a dielectric material. With further reference to FIG. 9, the dielectric lining layer 41 is moved from the steel plate 4 to the semiconductor device 1 via a transfer printing unit 5 such that the dielectric lining layer 41 lines a peripheral cavity-confining surface of the cavity 14 that is transverse to a plane of the lower metal layer 10 to isolate the upper metal layer 12 from the lower metal layer 10 while permitting access to the solder pad portion of the lower metal layer 10. Finally, the cavity 14 is filled with a liquid metal to form an electrical contact 42 that enables electrical connection of the lower metal layer 10 with an external circuit (not shown).

Note that, like the previous embodiment, the dielectric lining layer 41 is further configured so as to conceal the grounding trace 17 formed on the upper dielectric layer 13.

Figure 10:
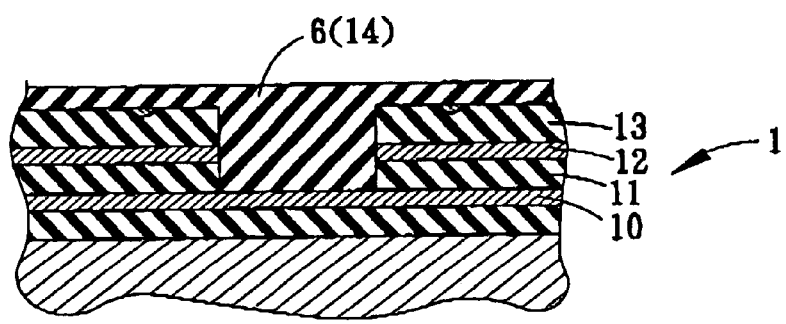
FIGS. 10 to 12 are fragmentary cross-sectional views illustrating the steps of the third preferred embodiment of a contact-forming method for a semiconductor device according to the present invention.
Figure 11:
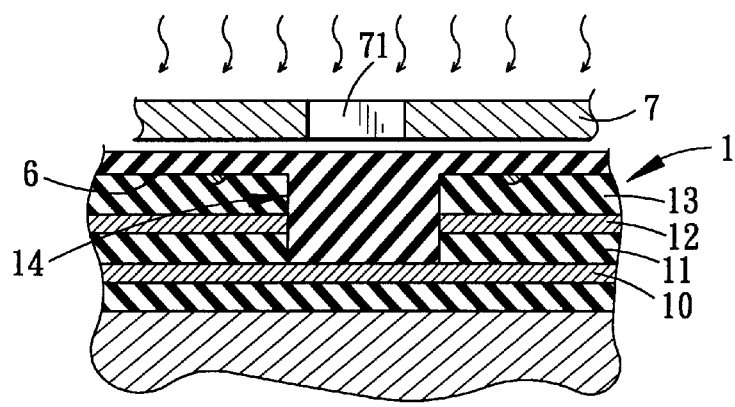
Figure 12:
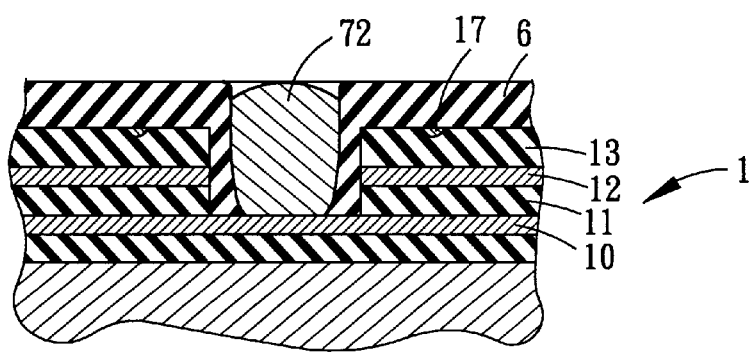

FIGS. 10 to 12 are fragmentary cross-sectional views illustrating the steps of the third preferred embodiment of a contact-forming method for a semiconductor device 1 according to the present invention. Unlike the first preferred embodiment, the dielectric lining layer 6 that is formed on the upper dielectric layer 13 and that fills the cavity 14 is made of a photoresist material. Thereafter, as shown in FIGS. 11 and 12, a patterned mask 7 is superimposed on the dielectric lining layer 6. The patterned mask 7 is formed with a light transmissive portion 71 that is registered with the cavity 14. Using known lithography techniques, including exposure to light and chemical developing, a central portion of the dielectric lining layer 6 is removed from the cavity 14. At this time, the dielectric lining layer 6 is configured to line a peripheral cavity-confining surface of the cavity 14 that is transverse to a plane of the lower metal layer 10 to isolate the upper metal layer 12 from the lower metal layer 10 while permitting access to the solder pad portion of the lower metal layer 10. Finally, the cavity 14 is filled with a liquid metal, such as a conductive metal paste, to form an electrical contact 72 that enables electrical connection of the lower metal layer 10 with an external circuit (not shown).

Like the previous embodiments, because the dielectric lining layer 6 is formed on the upper dielectric layer 13, the grounding trace 17 on the latter can be concealed to avoid formation of undesired connections with other circuits (not shown).

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications-and equivalent arrangements.

I claim:

1. A semiconductor device comprising:
    a lower metal layer;
    a lower dielectric layer on top of said lower metal layer;
    an upper metal layer on top of said lower dielectric layer;
    an upper dielectric layer on top of said upper metal layer;
    a contact region formed as a cavity that extends through said upper dielectric layer, said upper metal layer and said lower dielectric layer for access to said lower metal layer;
    a dielectric lining layer that lines a peripheral cavity-confining surface of said cavity and that is transverse to a plane of said lower metal layer to isolate said upper metal layer from said lower metal layer while permitting access to said lower metal layer, said dielectric lining layer made of a photoresist material; and
    an electrical contact that fills said cavity and enables external electrical connection with said lower metal layer.

2. The semiconductor device of claim 1, further comprising a grounding trace that is disposed on said upper dielectric layer and that surrounds said cavity, said dielectric lining layer further extending on top of said upper dielectric layer to cover said grounding trace.

3. A semiconductor device comprising:
    a lower metal layer;
    a lower dielectric layer on top of said lower metal layer;
    an upper metal layer on top of said lower dielectric layer;
    an upper dielectric layer on top of said upper metal layer;
    a contact region formed as a cavity that extends through said upper dielectric layer, said upper metal layer and said lower dielectric layer for access to said lower metal layer;
    a dielectric lining layer made of a photoresist material that lines a surface of said cavity to isolate said upper metal layer from said lower metal layer while permitting access to said lower metal layer; and
    an electrical contact that fills said cavity and enables external electrical connection with said lower metal layer.

4. The semiconductor device of claim 3, further comprising a grounding trace that is disposed on said upper dielectric layer and surrounds said cavity.

5. The semiconductor device of claim 4, wherein said dielectric lining layer extends on top of said upper dielectric layer to cover said grounding trace.

* * * * *